United States Patent
Doan et al.

(10) Patent No.: US 8,552,458 B2
(45) Date of Patent: Oct. 8, 2013

(54) SIDE BY SIDE LIGHT EMITTING DIODE (LED) HAVING SEPARATE ELECTRICAL AND HEAT TRANSFER PATHS

(75) Inventors: Trung Tri Doan, Baoshan Township (TW); Chen-Fu Chu, Hsinchu (TW); Wen-Huang Liu, Miao-Li County (TW); Feng-Hsu Fan, Jhonghe (TW); Hao-Chun Cheng, Donggang Township, Pingtung County (TW); Fu-Hsien Wang, Xinpu Township, Hsinchu County (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 601 days.

(21) Appl. No.: 12/824,163

(22) Filed: Jun. 26, 2010

(65) Prior Publication Data
US 2011/0316034 A1    Dec. 29, 2011

(51) Int. Cl.
*H01L 33/02* (2010.01)

(52) U.S. Cl.
USPC ................................. 257/99; 257/E33.058

(58) Field of Classification Search
USPC ........... 257/99, 100, 81, 89, 93, 98, 603–606, 257/E25.032, E29.335, E33.006, E33.058, 257/E33.062
See application file for complete search history.

(56) References Cited

U.S. PATENT DOCUMENTS

| | | | |
|---|---|---|---|
| 6,531,328 B1 * | 3/2003 | Chen | 438/26 |
| 7,186,580 B2 | 3/2007 | Tran et al. | |
| 7,195,944 B2 | 3/2007 | Tran et al. | |
| 7,378,288 B2 | 5/2008 | Tran et al. | |
| 7,432,119 B2 | 10/2008 | Doan | |
| 7,473,936 B2 | 1/2009 | Tran et al. | |
| 7,524,686 B2 | 4/2009 | Chu et al. | |
| 7,563,625 B2 | 7/2009 | Tran et al. | |
| 7,615,789 B2 | 11/2009 | Tran | |
| 7,629,195 B2 | 12/2009 | Tran et al. | |
| 7,646,033 B2 | 1/2010 | Tran et al. | |
| 7,687,322 B1 | 3/2010 | Doan et al. | |
| 7,723,718 B1 | 5/2010 | Doan et al. | |
| 7,759,146 B2 | 7/2010 | Tran | |
| 7,759,670 B2 | 7/2010 | Liu et al. | |
| 7,781,247 B2 | 8/2010 | Tran | |
| 7,781,783 B2 | 8/2010 | Yen et al. | |
| 7,811,842 B2 | 10/2010 | Liu et al. | |
| 2006/0163596 A1 * | 7/2006 | Kim et al. | 257/98 |

* cited by examiner

*Primary Examiner* — Selim Ahmed
(74) *Attorney, Agent, or Firm* — Stephen A. Gratton

(57) ABSTRACT

A light emitting diode includes a thermal conductive substrate having at least one electrical isolation layer configured to provide vertical electrical isolation and a heat transfer path through the substrate from a front side (first side) to a back side (second side) thereof. The light emitting diode includes an anode having a through interconnect, and a cathode having a through interconnect, which are arranged side by side on the substrate. The light emitting diode also includes a LED chip mounted to the substrate between the anode and the cathode. A method for fabricating the light emitting diode includes the steps of providing a thermal conductive substrate having an electrical isolation layer, forming an anode via and a cathode via side by side on a first side of the substrate part way through the substrate, forming an anode through interconnect in the anode via and a cathode through interconnect in the cathode via, thinning the substrate from a second side of the substrate to the anode through interconnect and the cathode through interconnect, and mounting a LED chip to the first side in electrical communication with the cathode through interconnect and the anode through interconnect.

11 Claims, 8 Drawing Sheets

SIDE BY SIDE LIGHT EMITTING DIODE (LED) HAVING SEPARATE ELECTRICAL AND HEAT TRANSFER PATHS

BACKGROUND

This disclosure relates generally to optoelectronic components, and more particularly to a side by side light emitting diode having separate electrical and heat transfer paths, and to a method for fabricating the light emitting diode (LED).

An optoelectronic system, such as a light emitting diode (LED) display, can include an array of from hundreds to thousands of light emitting diodes (LEDs). The light emitting diodes (LEDs) can generate a large amount of heat that must be dissipated. In addition, the LED circuitry associated with light emitting diodes (LEDs) can also generate heat. Both the light emitting diodes (LEDs) and the LED circuitry can be adversely affected by heat. For example, heat can shorten the life span of the light emitting diodes (LEDs) and the LED circuitry. Heat can also cause accidental firing of the light emitting diodes (LEDs), and signal transmission errors in the LED circuitry.

Heat dissipation in an optoelectronic system can include heat conducting components, such as a lead frame, and heat dissipating components, such as a heat sink. However, problems can occur if the heat conductive components are also used for electrical paths, or are in close proximity to the components for the electrical paths. In this case the heat gain can be cumulative, further adversely affecting device reliability.

In view of the foregoing, improved light emitting diodes (LEDs) having improved electrical and heat transfer paths, and methods for fabrication the light emitting diodes (LEDs) are needed in the art. However, the foregoing examples of the related art and limitations related therewith, are intended to be illustrative and not exclusive. Other limitations of the related art will become apparent to those of skill in the art upon a reading of the specification and a study of the drawings.

SUMMARY

A side by side light emitting diode includes an electrical path and a heat transfer path, which are substantially separate from one another. The light emitting diode includes a thermal conductive substrate having at least one electrical isolation layer configured to provide a heat transfer path through the substrate from a front side (first side) to a back side (second side) thereof. The light emitting diode also includes an anode having a through interconnect, and a cathode having a through interconnect, which are arranged side by side on the substrate. The light emitting diode also includes a LED chip mounted on the front side (first side) of the substrate in electrical communication with the anode and the cathode. An electrical path is provided through the anode from the back side (second side) to the front side (first side), through the LED chip, and then through the cathode from the front side (first side) to the back side (second side). A heat transfer path is provided from the LED chip through the electrical isolation layer on the front side (first side), and through the substrate from the front side (first side) to the back side (second side).

A method for fabricating the side by side light emitting diode includes the steps of providing a thermal conductive substrate, forming an anode via and a cathode via on a first side of the substrate side by side and part way through the substrate, forming an electrically insulating isolation layer on the first side in the anode via and the cathode via, forming an anode through interconnect in the anode via and a cathode through interconnect in the cathode via, thinning the substrate from a second side of the substrate to the anode through interconnect and the cathode through interconnect, and mounting a LED chip to the first side in electrical communication with the cathode through interconnect and the anode through interconnect.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1A:
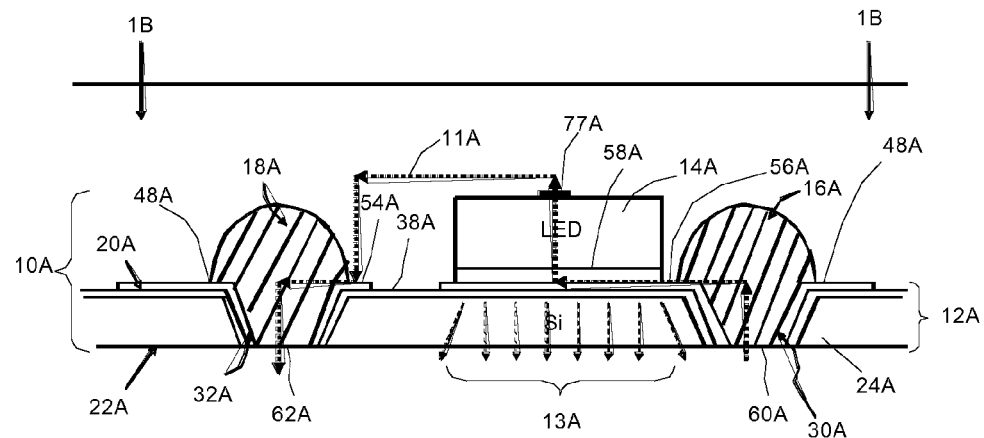
FIG. 1A is a schematic cross sectional view of a side by side light emitting diode (LED) having a thermal conductive substrate.
Figure 1B:
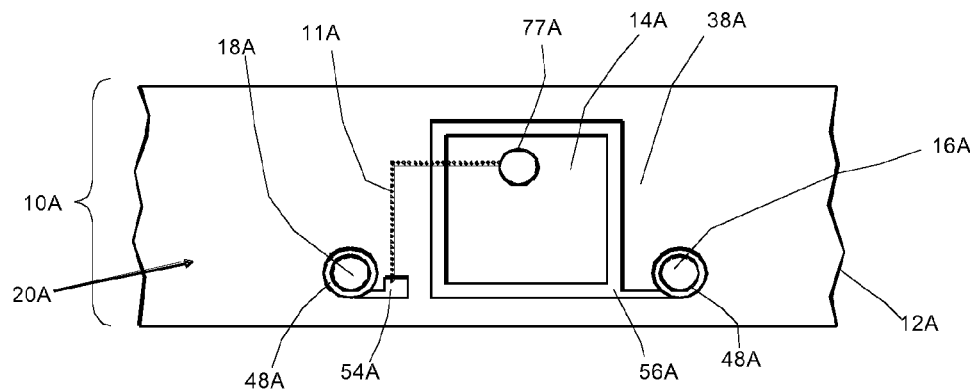
FIG. 1B is a schematic plan view of the side by side light emitting diode (LED) taken along line 1B-1B of FIG. 1A.

Referring to FIGS. 1A and 1B, a side by side light emitting diode 10A includes a thermal conductive substrate 12A, and a LED chip 14A mounted to the thermal conductive substrate 12A. The thermal conductive substrate 12A includes a front side 20A, a back side 22A, a silicon substrate 24A and an electrically insulating isolation layer 38A. As will be further explained, the thermal conductive substrate 12A provides vertical electrical isolation, and a thermal conductive heat transfer path as well.

The light emitting diode 10A also includes an anode 16A in the form of an anode through interconnect 30A in electrical communication with the LED chip 14A, and a cathode 18A in the form of a cathode through interconnect 32A in electrical communication with the LED chip 14A. The anode 16A and the cathode 18A are located side by side on the thermal conductive substrate 12A, such that the light emitting diode 10A is referred to as a side by side light emitting diode. In addition, the anode through interconnect 30A includes a back side contact 60A and the cathode through interconnect 32A includes a back side contact 62A. The back side contacts 60A, 62A provide electrical connection points to and from a mating substrate (not shown) such as a PCB (printed circuit board), mother board or module substrate.

As shown in FIG. 1B, the light emitting diode 10A also includes a cathode conductor 54A in electrical communication with the cathode through interconnect 32A, and an anode conductor 56A in electrical communication with the anode through interconnect 30A. In addition, the LED chip 14A can include an n-electrode 77A for making electrical connections to the cathode through interconnect 32A. The cathode conductor 54A and the anode conductor 56A can comprise portions of a patterned metallization layer 48A electrically insulated from the silicon substrate 24A by the isolation layer 38A. In addition, the anode conductor 56A can be sized and shaped to provide a mounting pad, and in embodiments to be further described, an electrical contact pad for the LED chip 14A.

As shown in FIG. 1A, an electrical path 11A through the light emitting diode 10A can be from the back side contact 60A through the anode through interconnect 30A and the anode 16A, through the anode conductors 56A, through the LED chip 14A, through the cathode through interconnect 32A and the cathode 18A to the back side contact 62A. The electrical path 11A can also include wires (not shown) formed by wire bonding to the cathode conductor 54A and to the n-electrode 77A, or conductors (not shown) formed by patterning, clipping, inkjet printing or screen printing of a conductive material in electrical contact with the cathode conductor 54A and the n-electrode 77A.

As also shown in FIG. 1A, a heat transfer path 13A through the light emitting diode 10A can be from the LED chip 14A, through the isolation layer 38A and through the silicon substrate 24A to the back side 22A. The electrical path 11A and the heat transfer path 13A are thus substantially separate rather than the being along the same path, which protects the reliability of the electrical path. In addition, the LED chip 14A can be placed directly over the isolation layer 38A, such that a direct heat transfer path is provided from the LED chip 14A through the silicon substrate 24A.

Figure 2A:
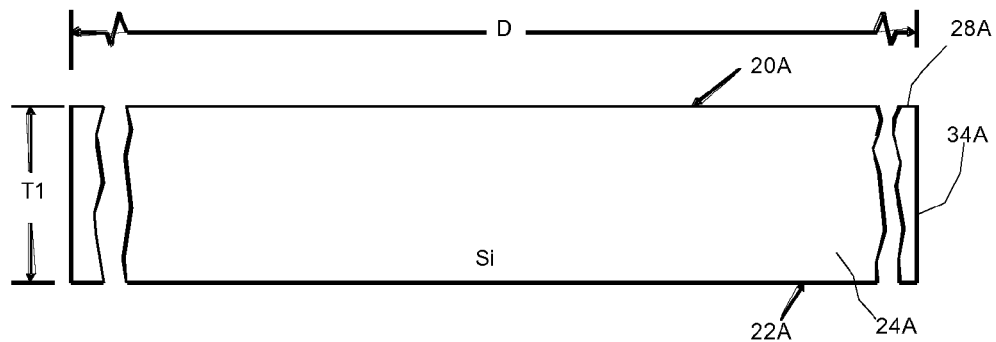
FIGS. 2A-2I are schematic cross sectional views illustrating steps in a method for fabricating the side by side light emitting diode (LED) of FIG. 1A.

Referring to FIGS. 2A-2I, steps in a method for fabricating the light emitting diode 10A (FIG. 1A) are illustrated. Although for illustrative purposes the steps of the method are shown in a particular order, the method can be practiced with a different order. Initially, as shown in FIG. 2A, the silicon substrate 24A can be provided. In the illustrative embodiment, the silicon substrate 24A comprise silicon (Si). However, the silicon substrate 24A can be replaced with another material such GaAs, SiC, AlN, $Al_2O_3$, or sapphire. The silicon substrate 24A can comprise a semiconductor wafer 34A having a standard diameter D of from 50-450 mm, and a full thickness T1 of from about 50-1000 µm. The semiconductor wafer 34A permits standard wafer fabrication equipment to be used to perform a wafer level method. By way of example, a 150 mm diameter wafer has a full thickness (T1) of about 675 µm, a 200 mm diameter wafer has a full thickness (T1) of about 725 µm, and a 300 mm diameter wafer has a full thickness (T1) of about 775 µm.

Figure 2B:
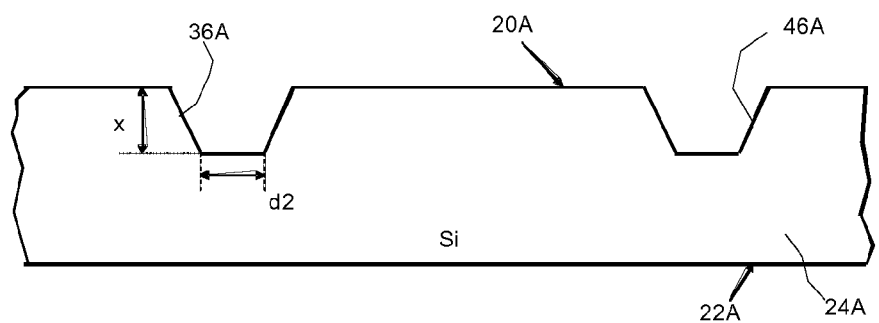

Next, as shown in FIG. 2B, a cathode and anode via forming step can be performed using a mask (not shown), such as an oxide or nitride hard mask, and a suitable process, such as wet or dry etching or laser drilling, to form cathode vias 36A and anode vias 46A in the silicon substrate 24A. The cathode and anode via forming step can be endpointed to form the cathode vias 36A and the anode vias 46A on the front side 20A part way through the silicon substrate 24A, with a depth x of from 1-500 µm from the front side 20A being representative. By way of example, the cathode vias 36A and the anode vias 46A can be formed using a crystalgraphic etch process performed using a wet etchant, such as a solution of KOH (44%) or TMAH (25%). This wet etchant could be used to etch <100> Si at approximately 1 µm/min, while etching $Si_3N_4$ at <1 Å/min and SiO2 at <20 Å/min, while <111> Si is etched at a much slower rate (i.e., $\frac{1}{100}$ of <100> Si). An isotropic etch process can be performed using a solution of HF, $HNO_3$ $CH_3COOH$ and $H_2O$.

As illustrated in FIG. 2B, with a crystalgraphic etch process, the cathode vias 36A and the anode vias 46A will be preferentially etched, with the sidewalls sloped at an angle of about 54.7 degrees from horizontal (i.e., a line parallel to the plane of the front side 20A). In addition, the cathode vias 36A and the anode vias 46A can include a planar bottom surface having a desired diameter d2 (e.g., 1-500 µm), which is dependent on the size of the openings in the mask, and on the etch time. Rather than wet etching, the cathode vias 36A and the anode vias 46A can be formed using a dry etch process, such as BOSCH etch. As another alternative, a drilling process, such as laser drilling, mechanical drilling or dicing drilling, can be employed to form the cathode vias 36A and the anode vias 46A. As shown in FIG. 1B, the cathode vias 36A and the anode vias 46 can have a generally circular peripheral shape when viewed from above, or alternately can have any suitable peripheral shape, such as rectangular, square, or polygonal.

Figure 2C:
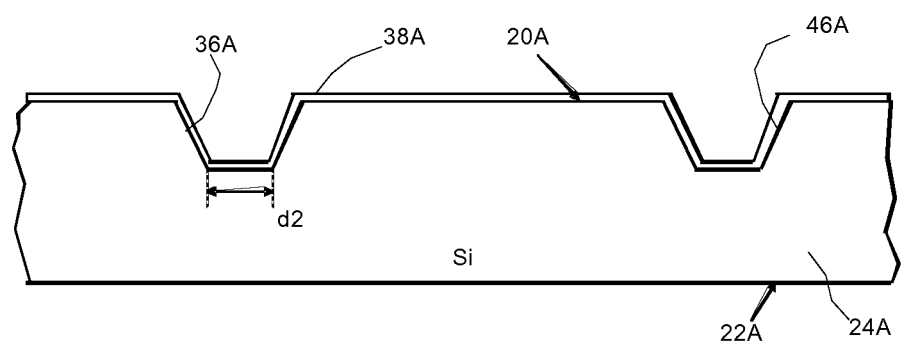

Next, as shown in FIG. 2C, an isolation layer forming step can be performed to form the isolation layer 38A on the front side 20A of the silicon substrate 24A, and on the sidewalls of the cathode vias 36A and the anode vias 46A. The isolation layer 38A preferably has a small thickness (e.g., 100 Å to 1 µm), such that the cathode vias 36A and the anode vias 46A remain open. The isolation layer 38A can comprise an electrically insulating material, such as an oxide (e.g., $SiO_2$) or a nitride (e.g., $Si_3N_4$), that can be either grown in place, or deposited using a suitable deposition process, such as CVD, PECVD, or ALD. Other suitable dielectric layers include $Al_2O_3$, $Ta_2O_5$ and titanium oxide deposited using a suitable process. $SiO_2$ could also be thermally grown using steam or a dry oxidation process. As another alternative, the isolation layer 38A can comprise a diamond or diamond like coating or deposition formed using a suitable coating or deposition process. As yet another alternative, the isolation layer 38A can comprise a polymer material, such as polyimide, that can be deposited on the front side 20A and into the cathode vias 36A and the anode vias 46A using a suitable process, such as deposition through a nozzle, or electrophoresis. As yet another alternative, the isolation layer 38A can comprise a polymer such as parylene, that can be vapor deposited on the front side 20A and into the cathode vias 36A and the anode vias 46A using CVD.

Figure 2D:
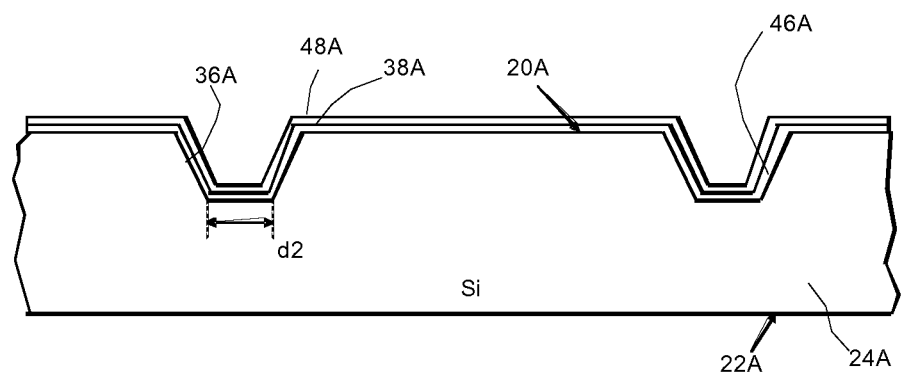

Next, as shown in FIG. 2D, a conductive layer forming step can be performed to form an electrically conductive metallization layer 48A on the isolation layer 38A on the front side 20A and in the cathode vias 36A and the anode vias 46A. The metallization layer 48A can comprise a single layer of a highly conductive metal such as Ti, Ta, Cu, W, TiW, Hf, Ag, Au, or Ni deposited using sputtering, PVD, CVD, evaporation, electrical chemical deposition or electroless chemical deposition. However, rather than a single layer of material, the metallization layer 48A can comprise a multi-metal stack, such as a bi-metal stack comprised of a conductive layer and a bonding layer (e.g., Ni/Cu, Ti/Cu, TiW/Cu), or multi layers such a Ta/TaN/Cu/Ni/Au and alloys of these metals. The metallization layer 48A can be formed using a suitable deposition process (i.e., additive process) such as PVD, electroless deposition, electroplating or PVD through a mask (not shown). As another example, the metallization layer 48A can be formed by blanket deposition of a metal layer followed by etching through a mask (i.e., subtractive process). In the illustrative embodiment, the conductive layer forming step can be performed to form the metallization layer 48A with a thickness that does not completely fill the cathode vias 36A and the anode vias 46A. In particular, the metallization layer 48A lines the sidewalls of the vias 36A, 46A rather than fills the vias 36A, 46A.

Figure 2E:
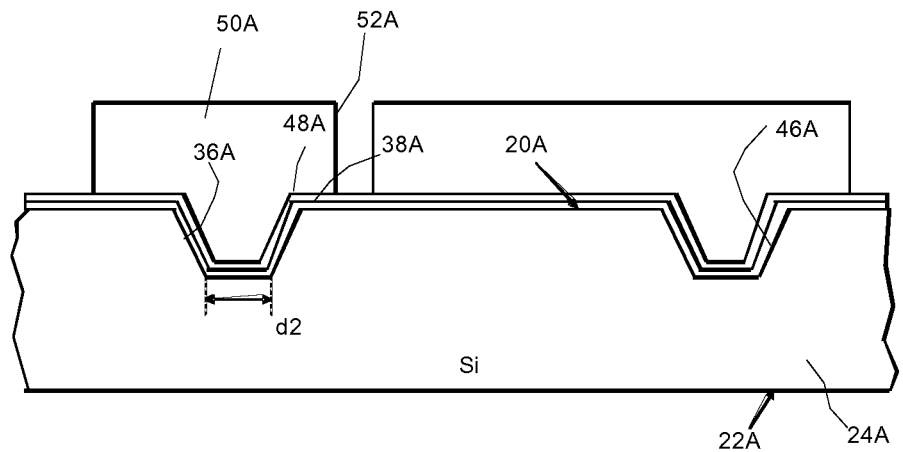
Figure 2F:
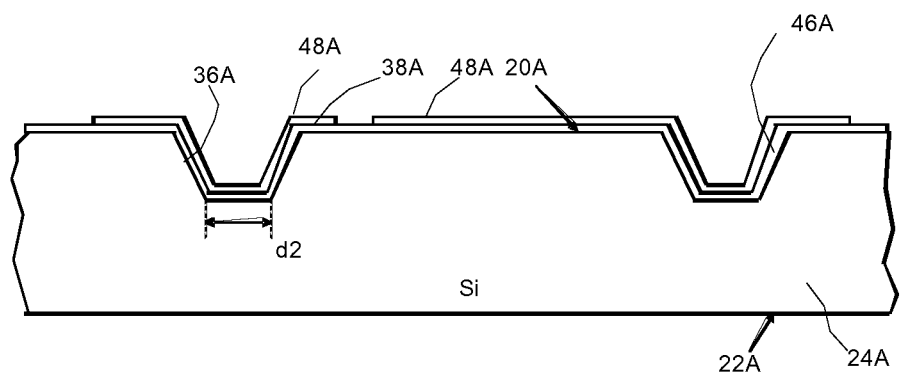

Next, as shown in FIG. 2E, a layer of resist can be formed on the front side 20A of the silicon substrate 24A, and a photolithographic process can be used to form a photomask 50A having a pattern of openings 52A with a desired size and shape. The openings 52A can be used to etch the metallization layer 48A using a suitable wet or dry etchant to form cathode conductors 54A (FIG. 1B) and anode conductors 56A (FIG. 1B) on the front side 20A. As shown in FIG. 2F, following formation of the openings 52A, the photomask 50A can be removed using a suitable stripping process. The metallization layer 48A in the cathode vias 36A is in electrical communication with the cathode conductors 54A (FIG. 1B), and the metallization layer 48A in the anode vias 46A is in electrical communication with the anode conductors 56A (FIG. 1B).

Figure 2G:
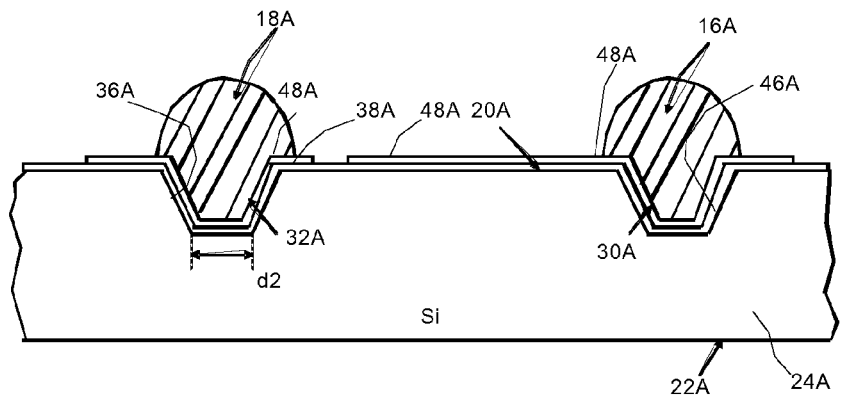

Next, as shown in FIG. 2G, a through interconnect forming step can be performed to form the anode through interconnects 30A in the anode vias 46A on the front side 20A circumjacent to the anode vias 46A. The through interconnect forming step also forms the cathode through interconnects 32A in the cathode vias 36A and on the front side 20A circumjacent to the cathode vias 36A. The anode through interconnects 30A and the cathode through interconnects 32A can comprise metal (e.g., solder, nickel), balls, bumps or pins, formed on the metallization layer 48A using deposition of a flowable metal into the vias 36A, 46A. For example, a flowable metal, such as solder or metal paste, can be deposited, or screen printed through a mask, to fill the vias 36A, 46A and form the through interconnects 30A, 32A as metal bumps. The anode through interconnects 30A and the cathode through interconnects 32A can also be formed using a ball bonding process or a stud bumping process. The anode through interconnects 30A and the cathode through interconnects 32A can also be formed using a two step process wherein the vias 36A, 46A are filled by deposition or screen printing, followed by a bump (or ball) forming step.

Many other techniques could also be used to form the anode through interconnects 30A and the cathode through interconnects 32A. For example, solder bump bonding (SBB) uses solder wire in a modified wire bonder to place a ball of solder directly onto a bond pad. The scrubbing action of the wire bonder causes the solder ball to bond to the bond pad. The solder wire is broken off above the bump, leaving the bump on the pad, where it can be reflowed. Solder bump bonding is a serial process, producing bumps one by one at rates up to about 8 per second. It has advantages in allowing closer spacing than printed bumps. Another technique is solder jetting, which places solder bumps on Ni—Au under bump metallization (UBM) by controlling a stream of droplets of molten solder. As another example, demand mode jetting systems use piezoelectrics or resistive heating to form droplets in much the same manner as an ink-jet printer. Mechanical positioning directs the droplet placement. Continuous mode jetting systems use a continuous stream of solder droplets with electrostatic deflection of the charged droplets to control placement.

In the illustrative embodiment, the through interconnects 30A, 32A comprise metal bumps formed of a bondable metal such as solder (e.g., SnPd, SnAg, SnCu, SnAgCu, NiSnAgCu, AuSn). The metallization layer 48A can comprise a metal, such as copper, which attracts and provides adhesion for filling the vias 36A, 46A. A representative range for the diameter of the through interconnects 30A, 32A can be from 1-1000 μm.

Figure 2H:
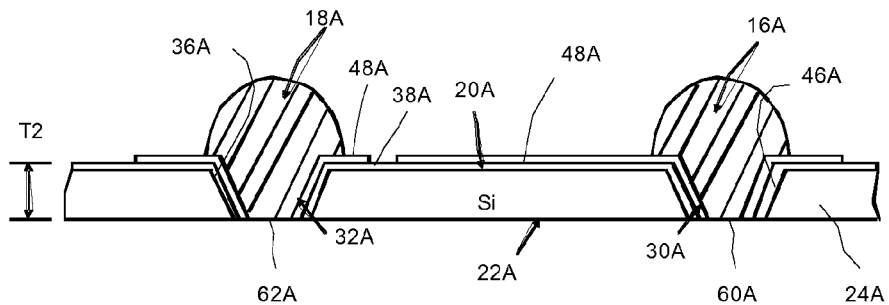

Next, as shown in FIG. 2H, a thinning step can be performed from the back side 22A to thin the silicon substrate 24A. The thinning step can be endpointed at the through interconnects 30A, 32A. The thinning step can be performed using a mechanical planarization process performed with a mechanical planarization apparatus, such as a grinder. This type of mechanical planarization process is sometimes referred to as dry polishing. One suitable mechanical planarization apparatus is manufactured by Okamoto, and is designated a model no. VG502. The thinning step can also be performed using a chemical mechanical planarization (CMP) apparatus. Suitable chemical mechanical planarization (CMP) apparatus are commercially available from manufacturers such as Westech, SEZ, Plasma Polishing Systems, and TRUSI. The thinning step can also be performed using an etch back process, such as a wet etch process, a dry etch process or a plasma etching process either performed alone or in combination with mechanical planarization. The thinning step can also be performed using a multi step process such as back grinding, followed by a soft polish step, then CMP and a cleaning step. The thickness T2 of the silicon substrate 24A can be selected as desired, with from 35 μm to 300 μm being representative. The thinned back side 22A has a smooth, polished surface, and is devoid of features. In addition, the thinning step forms the anode through interconnect 30A with a planar back side contact 60A, and the cathode through interconnect 32A with a planar back side contact 62A.

Figure 2I:
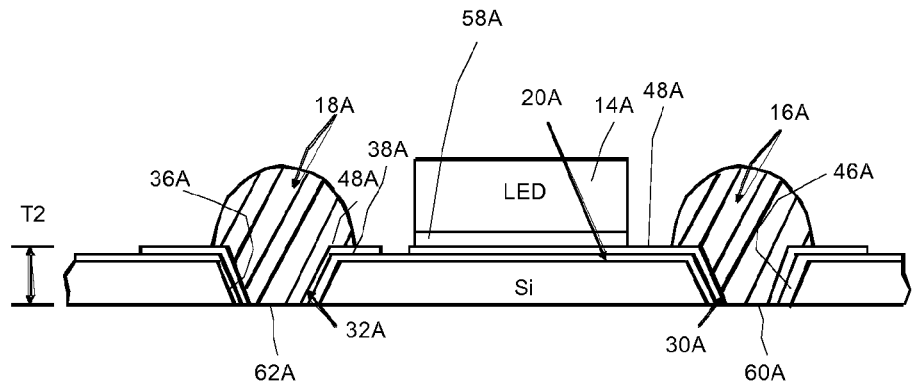

Next, as shown in FIG. 2I, a light emitting diode mounting step can be performed to mount the LED chip 14A on the front side 20A in electrical contact with the cathode conductors 54A (FIG. 1B) and the anode conductors 56A (FIG. 1B). The LED chip 14A can comprise a conventional LED chip fabricated using known processes. Suitable LED chips are commercially available from SEMILEDS, INC. located in Boise Id., and Miao-Li County, Taiwan, R.O.C. A bonding layer 58A formed using a solder reflow or a bumping process bonds the LED chip 14A to the conductors 54A, 56A (FIG. 1B).

Figure 3:
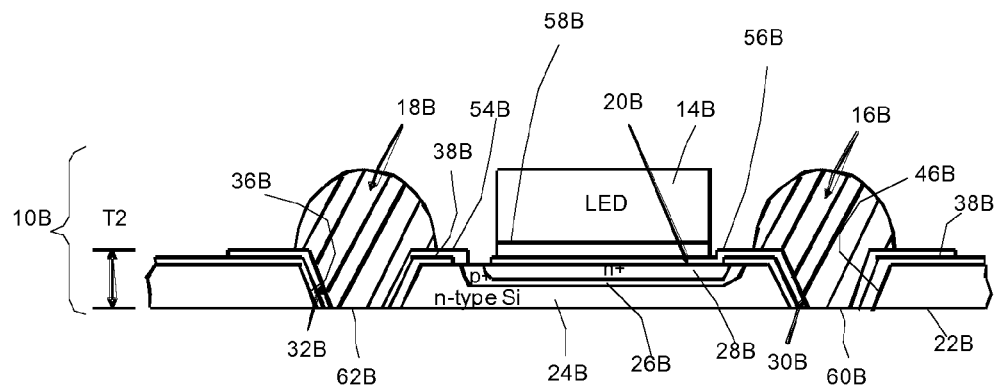
FIG. 3 is a schematic cross sectional view of an alternate embodiment side by side light emitting diode (LED) having a zener diode structure and an n-type semiconductor substrate.
Figure 3A:
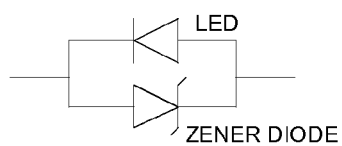
FIG. 3A is an electrical schematic of the light emitting diode (LED) of FIG. 3.

Referring to FIG. 3, an alternate embodiment side by side light emitting diode 10B is substantially similar to the light emitting diode 10A (FIG. 1A) but also includes an n-type semiconductor substrate 24B, an inner p+ layer 26B, an outer n+ layer 28B. As shown in FIG. 3A, the n-type semiconductor substrate 24B, the p+ layer 26B and the n+ layer 28B form an integral zener diode for the light emitting diode 10B that functions to prevent reverse bias voltage or inrush current. The light emitting diode 10B (FIG. 3) can be fabricated substantially as previously described for the light emitting diode 10A (FIG. 1A) but with suitable processes known in the art, such as doping or ion implantation, to form the p+ layer 26B and the n+ layer 28B.

As shown in FIG. 3, the light emitting diode 10B also includes an LED chip 14B mounted to the n-type semiconductor substrate 24B on an electrically conductive bonding layer 58B formed on the n+ layer 28B. The light emitting diode 10B also includes an anode 16B having a backside contact 60B in electrical communication with the LED chip 14B, and a cathode 18B having a backside contact 62B in electrical communication with the p+ layer 26B. The anode 16B and the cathode 18B are located side by side on the n-type semiconductor substrate 24B, such that the light emitting diode 10B is referred to as a side by side light emitting diode. The n-type semiconductor substrate 24B includes a front side 20B, a back side 22B, and an electrically insulating isolation layer 38B on the front side 20B. As with the light emitting diode 10A (FIG. 1A), the isolation layer 38B provides vertical electrical isolation, and a heat transfer path through the n-type semiconductor substrate 24B. The light emitting diode 10B also includes an anode through interconnect 30B and a cathode through interconnect 32B, which provide an electrical path through the n-type semiconductor substrate 12B. The isolation layer 38B also electrically insulates the anode through interconnect 30B and the cathode through interconnect 32B.

The light emitting diode 10B (FIG. 3) also includes a cathode conductor 54B and an anode conductor 56B on the isolation layer 38B, which provide electrical paths from the anode 16B and the cathode 18B to the LED chip 14B. The cathode conductor 54B is in electrical contact with the cathode through interconnect 32B and is also in electrical contact with a portion of the p+ layer 26B. The anode conductor 56B is in electrical contact with the anode through interconnect 30B and is also in electrical contact with a portion of the n+ layer 28B. The LED chip 14B includes a p-electrode, which is in direct electrical contact with the n+ layer 28B. The electrical paths from the cathode 18B and the anode 16B through the n+ layer 28B and the p+ layer 26B function as a one direction protective zener diode, which allows current flow in only one direction. Alternately, the zener diode can be configured to provide bi-directional protection using multiple n+/p+ layers suitably aligned and electrically connected on a semiconductor substrate. As another alternative the semiconductor substrate can comprise a p-type semiconductor the p+ layer 26B can be changed to n+ and the n+ layer 28B can be changed to p+.

Figure 4A:
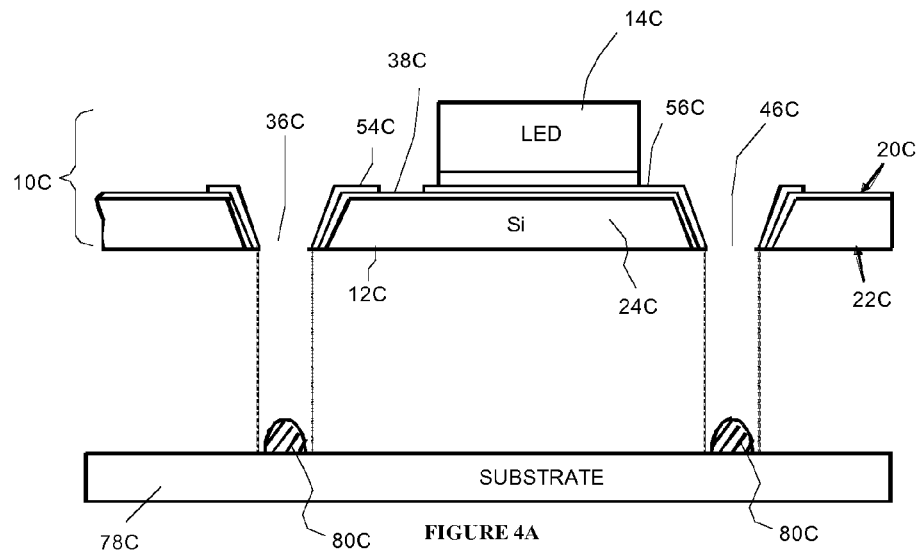
FIG. 4A-4C are schematic cross sectional views illustrating another alternate embodiment side by side light emitting diode (LED) adapted for mounting to a substrate having alignment placed solder bumps.
Figure 4B:
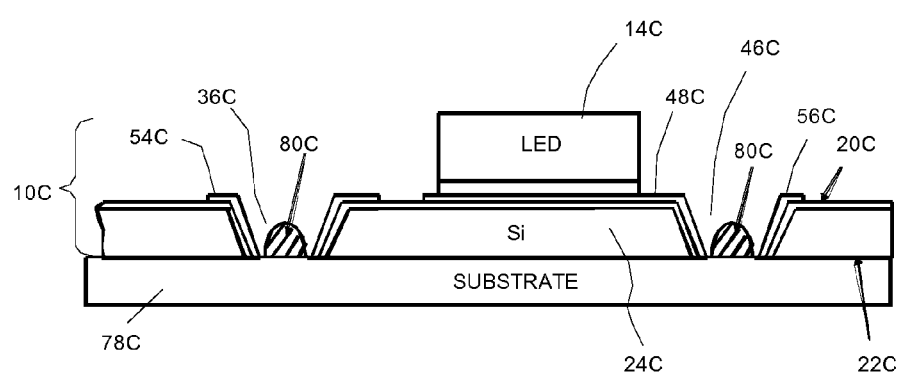
Figure 4C:
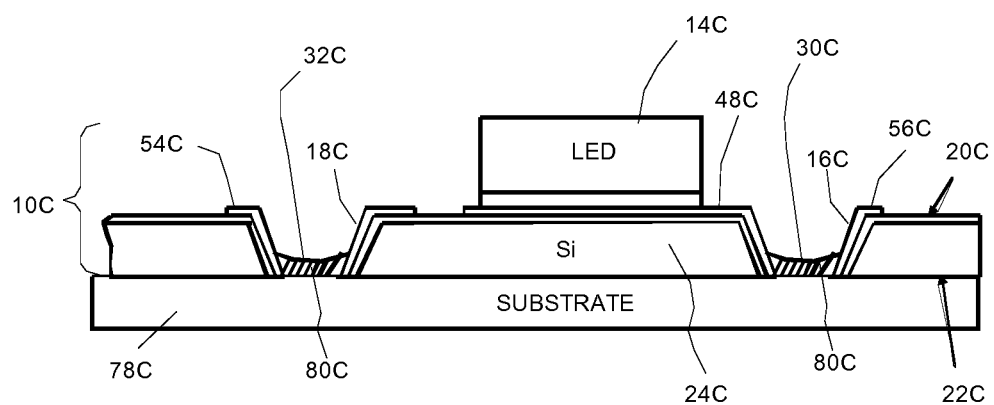

Referring to FIGS. 4A-4C, another alternate embodiment light emitting diode (LED) 10C is adapted for mounting to a substrate 78C, such as a printed circuit board (PCB), mother board or module substrate, having alignment bumps 80C formed thereon. As shown in FIG. 4A, the light emitting diode (LED) 10C includes an LED chip 14C mounted to a thermal conductive substrate 12C. The thermal conductive substrate 12C includes a front side 20C, a back side 22C and a silicon substrate 24C having through cathode vias 36C and through anode vias 46C. The light emitting diode (LED) 10C also includes an isolation layer 38C, cathode conductors 54C on the front side 20C lining the cathode vias 36C, and anode conductors 56C on the front side 20C lining the anode vias 46C. All of these elements correspond to the previous described elements having the same reference numerals but with the A and B suffixes. As also shown in FIG. 4A, the cathode vias 36C and the anode vias 46C align with the alignment bumps 80C on the substrate 78C.

As shown in FIG. 4B, the light emitting diode (LED) 10C can be placed on the substrate 78C with the alignment bumps 80C located in the cathode vias 36C and the anode vias 46C. Next, as shown in FIG. 4C, the alignment bumps 80C can be reflowed to fill the cathode vias 36C and the anode vias 46C, and electrically contact the cathode conductors 54C and the anode conductors 56C which line the vias 36C, 46C. In addition, the reflowed alignment bumps 80C form the cathode through interconnects 32C and the anode through interconnects 30C for the light emitting diode (LED) 10C. As another example, the through interconnects 30C, 32C can be formed by laser drilling part way through the silicon substrate 24C to form the vias 36C, 46C, followed by oxide deposition to form the isolation layer 38C, deposition and patterning of a metallization layer to form the conductors 54C, 56C, grinding to open the vias 36C, 46C (where the vias 36C, 46C are larger than the bumps 80C), optional backside metal deposition and patterning, attaching the LED die 14C and reflowing the bumps 80C.

Thus the disclosure describes an improved light emitting diode (LED) and an improved fabrication process for the light emitting diode (LED). While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting diode comprising:
a thermal conductive substrate having a flat first side, a flat second side and at least one electrical isolation layer on the first side;
an anode through interconnect comprising a metal filled anode via from the first side to the second side electrically isolated in a vertical direction by the electrical isolation layer in the anode via and an anode contact proximate to the second side;
a cathode through interconnect comprising a metal filled cathode via from the first side to the second side electrically isolated in a vertical direction by the electrical isolation layer in the cathode via and a cathode contact proximate to the second side, the anode through interconnect and the cathode through interconnect located side by side and top portions of the anode and cathode through interconnects are above the first side of the thermal conductive substrate; and
a LED chip mounted to the first side in electrical communication with the anode through interconnect and with the cathode through interconnect,
wherein an electrical path through the light emitting diode is from the anode contact, through the anode through interconnect, through the LED chip, through the cathode through interconnect and to the cathode contact and a heat transfer is from the LED chip through the electrical isolation layer and the thermal conductive substrate from the first side to the second side thereof.

2. The light emitting diode of claim 1 further comprising a cathode conductor in electrical communication with the cathode through interconnect, and an anode conductor in electrical contact with the LED chip and in electrical communication with the anode through interconnect.

3. The light emitting diode of claim 1 further comprising a substrate attached to the thermal conductive substrate by the anode through interconnect and the cathode through interconnect.

4. The light emitting diode of claim 1 wherein the thermal conductive substrate comprises a material selected from the group consisting of GaAs, SiC, AlN, $Al_2O_3$ and sapphire.

5. A light emitting diode comprising:
a thermal conductive substrate having at least one electrical isolation layer configured to provide a heat transfer path through the substrate from a first side to a second side thereof;
an anode through interconnect from the first side to the second side;
a cathode through interconnect from the first side to the second side, the anode through interconnect and the cathode through interconnect located side by side on the substrate; and
a LED chip mounted to the first side in electrical communication with the anode through interconnect and with the cathode through interconnect;
wherein the thermal conductive substrate comprises n-type silicon having a p+layer in electrical communication with the cathode through interconnect, and an n+layer in electrical contact with the LED chip and in electrical communication with the anode through interconnect configured to form a zener diode.

6. A light emitting diode comprising:
a thermal conductive substrate having at least one electrical isolation layer configured to provide a heat transfer path through the substrate from a first side to a second side thereof;
an anode through interconnect from the first side to the second side;

a cathode through interconnect from the first side to the second side, the anode through interconnect and the cathode through interconnect located side by side on the substrate; and a LED chip mounted to the first side in electrical communication with the anode through interconnect and with the cathode through interconnect;

wherein the thermal conductive substrate comprises p-type silicon having an n+layer in electrical communication with the cathode through interconnect, and an p+layer in electrical contact with the LED chip and in electrical communication with the anode through interconnect configured to form a zener diode.

7. The light emitting diode of claim 6 further comprising a substrate attached to the thermal conductive substrate by the anode through interconnect and the cathode through interconnect.

8. A light emitting diode comprising:

a semiconductor substrate having a first side, a second side, an isolation layer on the first side configured to provide vertical electrical isolation and a heat transfer path from the first side to the second side;

an anode through interconnect comprising a first via from the first side to the second side at least partially filled with a first metal bump;

a cathode through interconnect comprising a second via from the first side to the second side at least partially filled with a second metal bump;

a LED chip mounted to the first side between and in electrical communication with the anode through interconnect and the cathode through interconnect; and a zener diode comprising an inner first type silicon layer on the first side in electrical contact with the cathode through interconnect, and an outer second type silicon layer on the first side in electrical contact with the anode through interconnect and with the LED chip.

9. The light emitting diode of claim 8 wherein the semiconductor substrate comprises n-type silicon, the inner first type silicon layer comprises a p+layer and the outer second type silicon layer comprises an n+layer.

10. The light emitting diode of claim 8 wherein the semiconductor substrate comprises p-type silicon, the inner first type silicon layer comprises an n+layer and the outer second type silicon layer comprises a p+layer.

11. The light emitting diode of claim 8 wherein the zener diode comprises a plurality of silicon layers configured to provide bi-directional protection.

\* \* \* \* \*